(12) United States Patent
Komiyama et al.

(10) Patent No.: US 6,552,325 B1
(45) Date of Patent: *Apr. 22, 2003

(54) PHOTO DIODE ARRAY

(75) Inventors: Makoto Komiyama, Tokyo (JP); Yoshihito Sanpei, Tokyo (JP); Akira Miura, Tokyo (JP); Katsutoshi Sakakibara, Tokyo (JP); Tsuyoshi Yakihara, Tokyo (JP); Tadashige Fujita, Tokyo (JP); Shinji Kobayashi, Tokyo (JP); Sadaharu Oka, Tokyo (JP); Yasukazu Akasaka, Tokyo (JP)

(73) Assignee: Yokogawa Electric Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/560,758

(22) Filed: Apr. 28, 2000

(30) Foreign Application Priority Data

May 11, 1999 (JP) .......................................... 11-129933

(51) Int. Cl.[7] .............................................. H01J 40/14
(52) U.S. Cl. .............................. 250/214 R; 250/208.1; 250/214.1
(58) Field of Search ......................... 250/214 R, 208.1, 250/214.1, 214 PR, 214 LA; 348/294, 296, 302, 305

(56) References Cited

U.S. PATENT DOCUMENTS

| 5,254,848 A | * 10/1993 | Kashimura | 250/208.1 |
| 5,397,920 A | * 3/1995 | Tran | 136/256 |
| 5,446,493 A | * 8/1995 | Endo et al. | 348/273 |

* cited by examiner

Primary Examiner—Robert H. Kim
Assistant Examiner—Courtney Thomas
(74) Attorney, Agent, or Firm—Moonray Kojima

(57) ABSTRACT

A photo diode array having improved linearity, wherein a plurality of photo diodes are arranged in an array with a plurality of electrodes connected to both ends of the light receiving surface of each photo diode to obtain current generated in each photo diode.

13 Claims, 5 Drawing Sheets

PHOTO DIODE ARRAY

BACKGROUND OF THE INVENTION

1. Field of Invention

This invention relates to a photo diode array; and more particularly, to such photo diode array having improved linearity.

2. Description of the Prior Art

A photo diode is formed, for example, by providing a PN junction with a p-type region on the light receiving surface side and an n-type region on the substrate side. A current generated by light applied to the photosensitive area flows from a cathode to an anode.

FIG. 1 is a sectional view of an exemplary conventional photo diode, wherein a p-type diffused region 2 is formed on one side of n-type layer 1 which is a substrate; n-contact 5 is formed on the opposite side of n-type layer 1; and passivation layer 3 is formed on the light receiving surface side, where p-type diffused region 2 is formed. A p-contact 4, connected to p-type diffused region 2, is formed by removing part of passivation layer 3 using an etching process, or the like.

The photo diode of FIG. 1 is operated as follows. Electrons, generated in the photo diode, by application of input light 100 to the photo sensitive area, are accumulated in n-type layer 1, while holes are accumulated in p-type diffused region 2. Accordingly, n-type layer 1 is negatively charged and p-type diffused region 2 is positively charged. Thus, when an external circuit is connected between p-type diffused region 2 and n-type layer 1, electrons and holes flow toward opposite layers from n-type layer 1 and p-type diffused region 2, respectively.

For example, an electron generated in p-type diffused region 2, shown as "EL01" in FIG. 1 is accelerated towards n-type layer 1 by the electric field in the photo diode and accumulated there. In a similar manner, a hole generated in n-type layer 1, shown as "HL01", is accelerated towards p-type diffused region 2 and accumulated there. A photo diode array may comprise a plurality of such photo diodes arranged in an array.

FIG. 2 shows an example of a configuration of a plurality of photo diodes arranged in an array, wherein a plurality of photo diodes 6a–6e are arranged in the array on a substrate (not shown, for sake of convenience, but understood to be present. Same comments apply with the remainder of the drawing, namely, FIGS. 3–5) so that the photo sensitive areas thereof are oriented in a particular direction and electrodes 7a–7e are connected to one end of the photo sensitive area of each photo diode 6a–6e, respectively.

Operation of the FIG. 2 array is as follows. When light is made incident to the photo sensitive area of photo diodes 6a–6e, currents are generated between each light receiving surface side and each opposite side. The currents are outputted to the outside via electrodes 7a–7e, respectively. For example, holes generated in photo diodes 6a–6e are outputted via electrodes 7a–7e.

However, disadvantageously, in conventional arrays, current values outputted thereby may vary according to the location on the photo sensitive area at which the input light is applied. For example, when the input light is made incident to a portion-marked "P001", the distance from that spot to electrode 7e is longer than when the input light is made incident to the portion marked "P002". This causes a voltage drop due to the resistance that exists between the respective portions and the electrode. Hence, the current value which is outputted can vary. In other words, a problem exists in that in the prior art, linearity deteriorates depending on the location on the light sensitive area at which the input light is made incident. Specifically, when a high current is generated by the light being made incident to the spot marked "P001", linearity deterioration increases, as compared to the light being made incident to spot "P002", because the generated voltage drop increases further.

In order to reduce this linearity deterioration, a bias voltage which forms a reverse bias is generally applied to the photo diode. However, although this technique may improve frequency response and some amount of the linearity, in such a case, there is still the problem that this causes an increase in dark current which increases noise, and increases danger of destruction of the photo diode.

SUMMARY OF THE INVENTION

Accordingly, an object of the invention is to overcome the foregoing and other deficiencies and disadvantages of the prior art.

Another object is to realize a photo diode array wherein linearity is greatly improved.

DETAILED DESCRIPTION OF THE PREFERRED EMBODIMENTS

Figure 3:
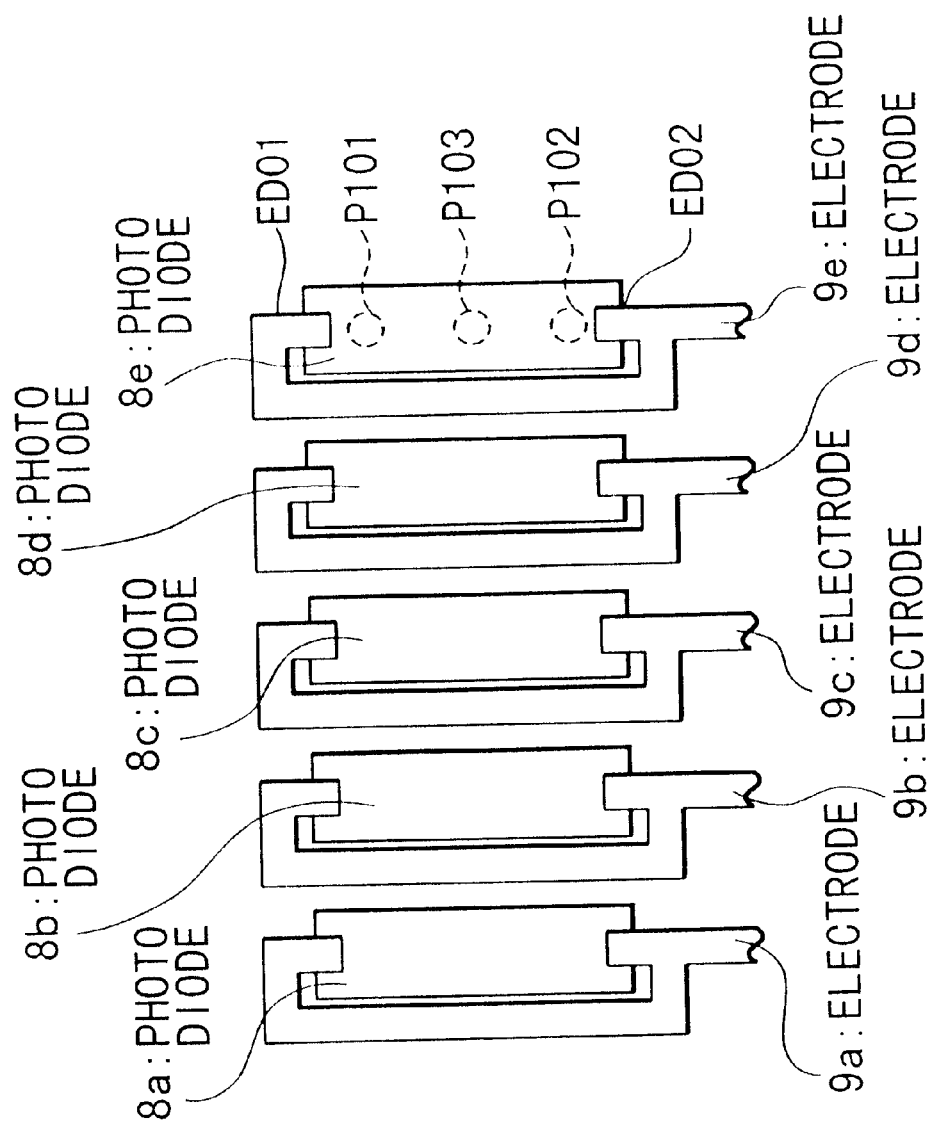
FIG. 3 is a diagram of an illustrative embodiment of a photo diode array of the invention.

In FIG. 3, which shows an illustrative photo diode array of the invention, photo diodes 8a–8e, are arranged on a substrate (not shown) forming an array so that the photo sensitive areas thereof are oriented in the same predetermined direction. Electrodes 9a–9e are connected to one end of the photo sensitive areas of photo diodes 8a–8e, respectively, and also connected to the other end of the photo sensitive areas of photo diodes 8a–8e, respectively. The electrodes are extended so that the photo sensitive areas of two adjacent diodes are disposed therebetween, as shown. In addition, electrodes 9a–9e are connected to both ends of photo sensitive areas of photo diodes 8a–8e, respectively, and wired on the substrate in a direction downward, as depicted in FIG. 3, and led out to the outside.

Figure 1:
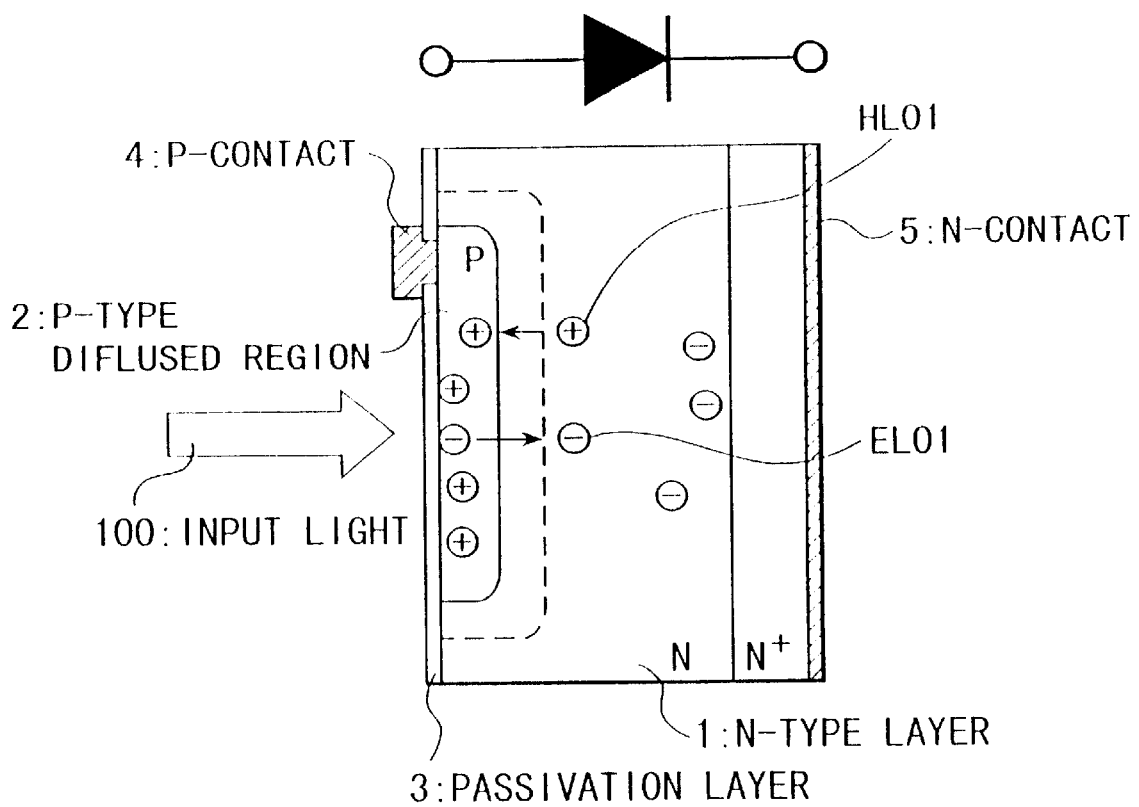
FIG. 1 is a sectional view depicting a conventional photo diode.
Figure 2:
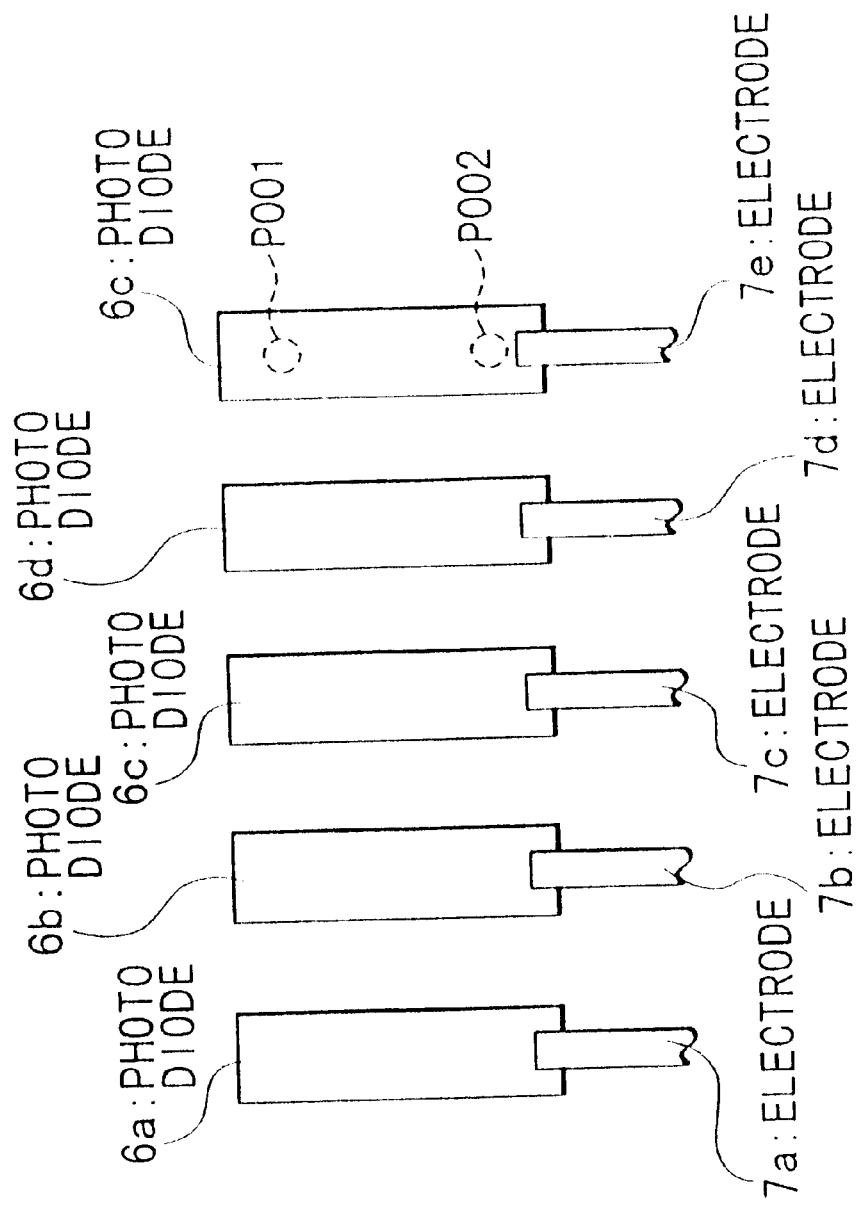
FIG. 2 is a diagram depicting arrangement of a conventional photodiode in an array.

Operation of the embodiment is as follows. Since the array of FIG. 3 is configured to obtain currents out of both ends of each photo sensitive area of photo diodes 8a–8e, the respective distances from the spots at which the input light are made incident to electrodes 9a–9e are shortened, compared with those of the prior art photo diode array of FIG. 2, for example. Thus, the resistance between the electrodes and the corresponding locations at which the input light is made incident is reduced. In other words, deterioration of linearity is reduced in the invention.

For example, in FIG. 3, if the input light is made incident to the portion marked "P101", the effective distance from the portion "P101" to electrode 9e is that from the portion "P101" to the connecting portion marked "ED01". On the other hand, if the input light is made incident to the portion marked "P102", the effective distance from the portion "P102" to electrode 9e is that from portion "P102" to the connecting portion marked "ED02". That is to say, in both cases, where the input light is made incident to the portions "P101" and "P102", the effective distance to electrode 9e are similar. In addition, if the input light is made incident to the portion marked "P103" (which is located at the center), the effective distance between portion "P103" and electrode 9e is approximate ½, when compared to the conventional array of FIG. 2. Since this effective distance, from the center to the end, represents the maximum, even in the worst case, deterioration of linearity is reduced by ½.

As a result, the currents attained by the ends ED01 and ED02 of electrodes 9a–9e, out of both ends of the photo sensitive areas of photo diodes 8a–8e are from shortened distances between the input light applied portions and electrodes 9a–9e, respectively. Hence, deterioration of linearity is reduced by the invention.

Figure 4:
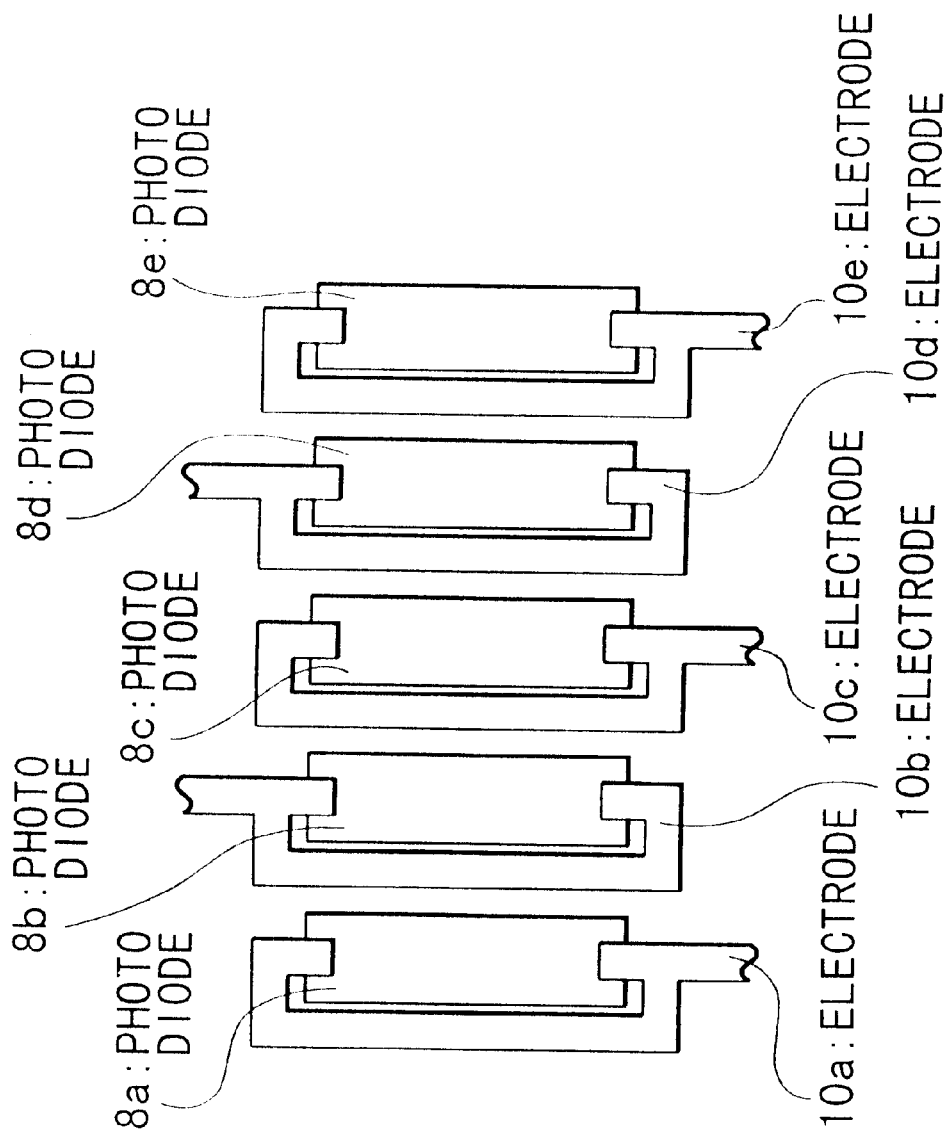
FIG. 4 is a diagram depicting another illustrative embodiment of the invention.

In the embodiment of FIG,. 3, there is shown only one lead out terminal to electrodes 9a–9e (i.e. towards the bottom). However, the lead out terminals can be provided in both directions (ie. towards the bottom and top). FIG. 4 shows a second embodiment, wherein the lead out terminals are lead out in different directions and alternately.

The photo diodes 8a–8e are arranged similar to the array in FIG. 3. Electrodes 10a and 10e are connected to both ends of the photo sensitive areas of photo diodes 8a–8e, respectively, as in FIG. 3. However, the lead out terminals or electrodes 10a, 10c and 10e are lead out in a direction directed toward the bottom of FIG. 4, while lead out terminals or electrodes 10b and 10d are lead out in an opposite direction towards the top of FIG. 4.

The basic operation of FIG. 4 is the same as that of FIG. 3 with the following differences. By alternately changing the lead out direction, advantageously, wiring to the Electrodes is easier. Also, another advantage is attained in that the alternate lead out terminals can be used in situations where it is difficult to secure wiring spaces for the electrodes because the photo diodes are arranged in a highly dense manner. Although the lead out terminals are alternately changed in direction, such lead out direction is not limited to the embodiment depicted. For example, the lead out direction may be changed regularly, such as for every two, three, etc, lead out terminals, or may be changed irregularly.

As a result, according to the invention, wiring of the terminals and electrodes is made easier and the entire process is simplified. The wiring spaces for the electrodes are secured by leading out terminals from both ends of the photo sensitive areas.

Figure 5:
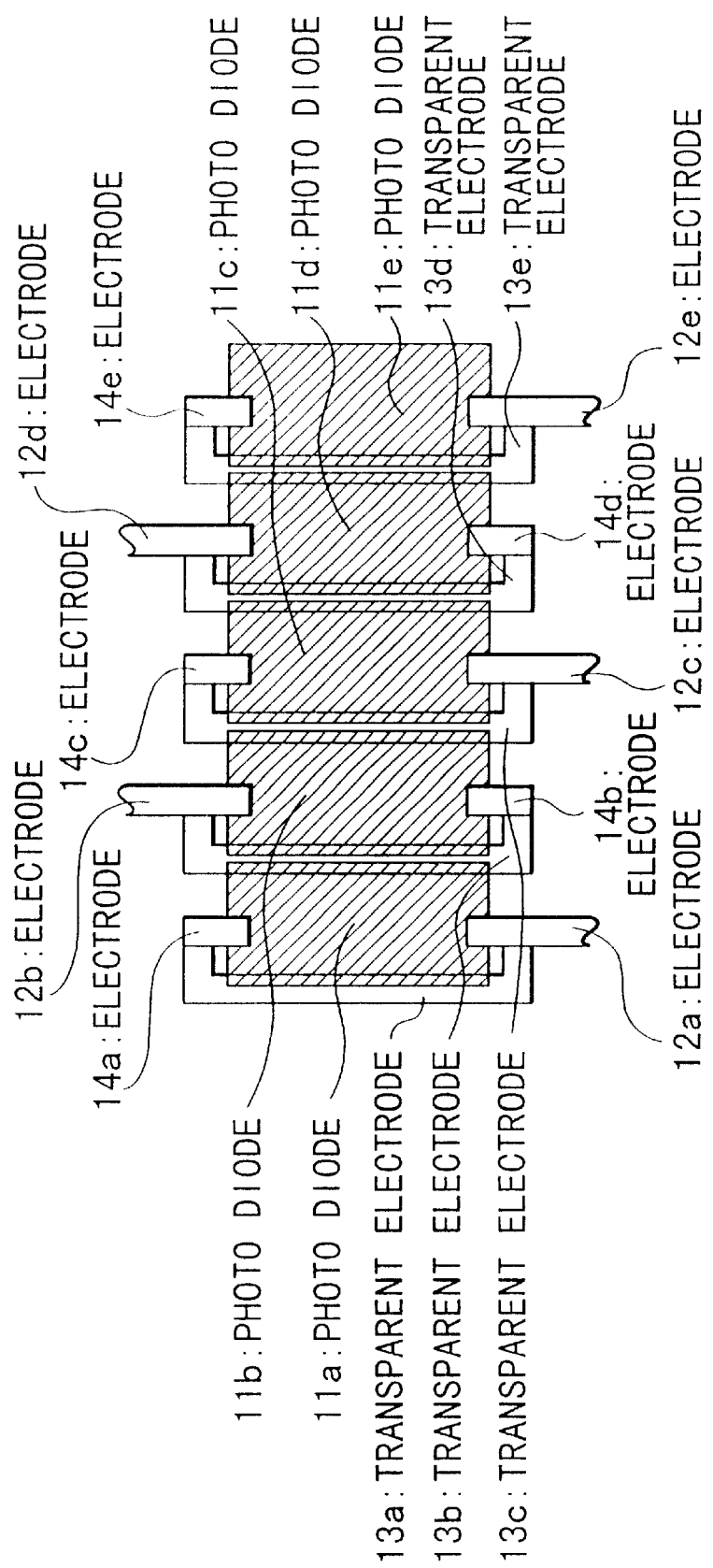
FIG. 5 is a diagram depicting a further embodiment of the invention.

In another embodiment, the electrode extensions which interconnect the end portions connected to the ends of the photo sensitive areas, may be made of transparent material to extend the photo sensitive areas, as shown for example, in FIG. 5.

In FIG. 5, photo diodes 11a–11e are arranged to form an array on a substrate (not shown) so that the light receiving surfaces face to the side. Electrodes and lead out terminals 12a–12e are connected to one end of the photo sensitive area of photo diodes 11a–11e, respectively, and electrodes 14a–14e are connected to the other ends of the photo diodes 11a–11e, respectively, as depicted. Furthermore, electrodes 12a and 14a are connected to each other by transparent extension 13a, located between adjacent photo diodes; and electrodes and lead out terminals 12b and 14b are connected to each other by transparent electrode extension 13b located between adjacent photo diodes. Also, electrodes 12c, 12d, and 12e, and electrodes 14c, 14d, and 14e are connected to each other by corresponding transparent extensions 13c, 13d and 13e, extending between adjacent photo diodes. Furthermore, electrodes 12a, 12c and 12e have lead out terminals which lead out to the outside in a direction directed towards the bottom of FIG. 5. Electrodes 12b and 12d are wired to have lead out terminals which lead out to the outside in a direction directed toward the top of FIG. 5.

Operation of the embodiment of FIG. 5 is as follows. The basic operation is the same as in FIG. 3 with the following differences. By making the electrodes which extend between adjacent photo diodes transparent, the light receiving areas of the photo diodes are increased, compared with the embodiments of FIG. 3 and FIG. 4, due to the transparent electrode extensions 13a–13e being overlapped with the photo diodes. As a result, by employing the transparent electrode extensions 13a–13e between adjacent photo diodes, the photo sensitive area of each photo diode is enlarged.

The transparent material may be an oxide of indium-tin.

Although the embodiments of FIGS. 3,4 and 5 show five photo diodes, the number of photo diodes is not limited thereto. Any number of photo diodes may be used to form the array.

Moreover, in the embodiments of FIGS. 3,4 and 5, the electrode extensions connecting the end electrodes are disposed between the respective photo diodes. These extensions may be disposed on either the right or left side of any particular photo diode. Moreover, the lead out terminals may be directed in any one or more directions in any pattern, such as alternately, in multiples, or singly, or in regular or irregular patterns.

The invention provides the following advantages and effects. The distance between the locations at which the input light is made incident and the electrodes is shortened by using a configuration wherein current produced by the diode is outputted from both ends of the photo sensitive area of each photo diode. Thus, deterioration of linearity is reduced. Also, the photo sensitive area of the photo diode is increased by making the the electrode extension which interconnect the electrode ends out of transparent material. Also, the lead out terminals may be directed in one or more directions in any desired pattern.

The foregoing description is illustrative of the principles of the invention. Numerous extensions and modifications thereof would be apparent to the worker skilled in the art. All such modifications and extensions are to be considered to be within the spirit and scope of the invention.

What is claimed is:

1. A photo diode consisting of:
   an elongated photo sensitive surface having at least two contact portions located directly opposite each other;
   at least a first electrode connected to one of said at least two contact portions;
   at least a second electrode connected to a second of said at least two contact portions; and
   a conductive extension interconnecting said at least first and second electrodes so that light impinging at a point on said photo sensitive surface between said at least two contact portions causes electrons to flow from said point of impingement to one of said first and second electrodes located closest to said point of impingement whereby the distance traveled by said electron flow to the closest electrode is a maximum at one half the distance between said at least two contact portions.

2. The photo diode of claim 1, further comprising a conductive lead terminal connected to said first electrode.

3. The photo diode of claim 1, further comprising a conductive lead terminal connected to said second electrode.

4. The photo diode of claim 1, further comprising a first conductive terminal connected to said first electrode and a second conductive terminal connected to said second electrode.

5. The photo diode of claim 1, wherein said conductive estension is a transparent material.

6. The photo diode of claim 5, wherein said transparent material is indium tin oxide.

7. The photo diode of claim 1, further comprising a conductive lead terminal connected to an electric circuit comprising said first electrode, said second electrode and said extension.

8. A photo diode array comprising:
   a plurality of photo diodes arranged in an array, each of said photo diodes consisting of an elongated photo sensitive surface having at least two contact portions located directly opposite each other;
   a plurality of electrodes, each connected to a respective one of said two contact portions of each one of said plurality of photo diodes;
   a plurality of conductive extensions each interconnecting an electrode connected to one of said at least two contact portions of one photodiode and another connected to another of said at least two contact portions of that same photo diode, so that light impinging at a point on said photo sensitive surface causes electrons to flow from said point of impingement to an electrode located closest to said point of impingement whereby the distance traveled by said electron flow to the closest electrode is a maximum at one half the distance between said at least two contact portions.

9. The array of claim 8, wherein said plurality of conductive extensions comprise a transparent material.

10. The array of claim 9, wherein said transparent material is indium tin oxide.

11. The array of claim 8, further comprising a plurality of conductive lead terminals, each connected respectively to one or more electrodes disposed at said at least two contact portions of each photo sensitive surface of each photo diode.

12. The array of claim 11, wherein each of said plurality of conductive lead terminals is connected to a respective alternative electrode disposed at said at least two contact portions in said photo sensitive surface of each of said plurality of photo diodes.

13. The array of claim 8, further comprising a plurality of conductive lead terminals, each connected to an electric circuit comprising said electrodes connected to said at least two contact portions of each photo diode and said conductive extension connecting said electrodes in each photo diode.

* * * * *